(12) United States Patent
Endo (10) Patent No.: US 9,130,031 B2
(45) Date of Patent: Sep. 8, 2015

(54) WAFER PROCESSING METHOD

(71) Applicant: DISCO CORPORATION, Tokyo (JP)

(72) Inventor: Tomohiro Endo, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/260,781

(22) Filed: Apr. 24, 2014

(65) Prior Publication Data

US 2014/0322847 A1  Oct. 30, 2014

(30) Foreign Application Priority Data

Apr. 24, 2013  (JP) ................................. 2013-091279

(51) Int. Cl.
| H01L 21/00 | (2006.01) |
| H01L 21/78 | (2006.01) |
| B23K 26/40 | (2014.01) |
| H01L 33/00 | (2010.01) |

(52) U.S. Cl.
CPC ................ *H01L 21/78* (2013.01); *B23K 26/40* (2013.01); *H01L 33/0095* (2013.01)

(58) Field of Classification Search
CPC ..... H01L 21/268; H01L 21/78; H01L 21/782; H01L 21/784; H01L 22/12; H01L 27/14623; H01L 27/14625; H01L 27/14627
USPC ............. 438/33, 68, 113, 458, 460, 462, 463, 438/535, 662, FOR. 386
See application file for complete search history.

(56) References Cited

U.S. PATENT DOCUMENTS

| 2002/0125233 A1* | 9/2002 | Horn et al. ............... 219/121.72 |
| 2002/0177288 A1* | 11/2002 | Brown et al. ................. 438/463 |
| 2007/0176181 A1* | 8/2007 | Kusunoki ......................... 257/79 |
| 2008/0023456 A1* | 1/2008 | Watanabe ................ 219/121.82 |
| 2009/0121337 A1* | 5/2009 | Abe et al. ...................... 257/686 |

FOREIGN PATENT DOCUMENTS

JP  2002-192370  7/2002

* cited by examiner

*Primary Examiner* — Kyoung Lee
*Assistant Examiner* — Joannie A Garcia
(74) *Attorney, Agent, or Firm* — Greer Burns & Crain Ltd.

(57) ABSTRACT

A wafer processing method including a modified layer forming step of applying a laser beam having a transmission wavelength to a substrate from the back side of the substrate along division lines. The modified layer forming step includes the steps of making the polarization plane of linearly polarized light of the laser beam parallel to the direction perpendicular to each division line, shifting the beam center of the laser beam from the optical axis of a focusing lens of a focusing unit for focusing the laser beam, in the direction perpendicular to each division line, and shifting the focal point of the laser beam by the focusing lens in the same direction as the direction where the beam center of the laser beam has been shifted.

1 Claim, 10 Drawing Sheets

WAFER PROCESSING METHOD

BACKGROUND OF THE INVENTION

1. Field of the Invention

The present invention relates to a wafer processing method of dividing a wafer into a plurality of devices along a plurality of division lines, the devices being formed on the front side of the wafer and partitioned by the division lines.

2. Description of the Related Art

As well known in the art, in a semiconductor device fabrication process, a functional layer composed of an insulating film and a functional film is formed on the front side of a substrate such as a silicon substrate, and a plurality of semiconductor devices such as ICs and LSIs are formed like a matrix from this functional layer, thus obtaining a semiconductor wafer having the plural semiconductor devices. The plural semiconductor devices are partitioned by a plurality of crossing division lines formed on the front side of the semiconductor wafer. The semiconductor wafer is divided along these division lines to obtain the individual semiconductor devices as chips.

Further, in an optical device fabrication process, an optical device wafer is provided by forming an optical device layer composed of an n-type nitride semiconductor layer and a p-type nitride semiconductor layer on the front side of a sapphire substrate or a silicon carbide substrate. The optical device layer is partitioned by a plurality of crossing division lines to define a plurality of regions where a plurality of optical devices such as light emitting diodes and laser diodes are respectively formed. The optical device wafer is cut along the division lines to thereby divide the regions where the optical devices are formed from each other, thus obtaining the individual optical devices as chips.

As a method of dividing a wafer such as a semiconductor wafer and an optical device wafer along the division lines, there has been tried a laser processing method of applying a pulsed laser beam having a transmission wavelength to the wafer along the division lines in the condition where the focal point of the pulsed laser beam is set inside the wafer in a subject area to be divided. More specifically, this wafer dividing method using laser processing includes the steps of applying a pulsed laser beam having a transmission wavelength to the wafer from one side of the wafer along the division lines in the condition where the focal point of the pulsed laser beam is set inside the wafer to thereby continuously form a modified layer inside the wafer along each division line and next applying an external force to the wafer along each division line where the modified layer is formed to be reduced in strength, thereby dividing the wafer into the individual devices (see Japanese Patent No. 3408805, for example).

In the laser processing method for forming the modified layer inside the wafer, the laser beam having a transmission wavelength to the wafer is used. Accordingly, in the case that the wafer is formed of silicon, a laser beam having a wavelength of 1064 nm is used, whereas in the case that the wafer is formed of sapphire, a laser beam having a wavelength of 1064 nm or 532 nm is used.

Further, in the case of forming the modified layer inside the wafer along each division line, it is known that a good modified layer can be formed by making the polarization plane of linearly polarized light of the laser beam parallel to the direction perpendicular to each division line and then applying the laser beam along each division line. Accordingly, in the case of processing an optical device wafer composed of a sapphire substrate and a light emitting layer formed on the front side of the sapphire substrate, the light emitting layer being partitioned by a plurality of crossing division lines to define a plurality of regions where a plurality of optical devices are respectively formed, a good modified layer can be formed inside the sapphire substrate along each division line by applying the laser beam to the wafer from the back side of the sapphire substrate along each division line in the condition where the focal point of the laser beam is set inside the sapphire substrate.

SUMMARY OF THE INVENTION

However, in the method of forming the modified layer inside the wafer along each division line, there is a problem such that a part of the laser beam not contributing to the formation of the modified layer acts as through light passing through the sapphire substrate to reach the light emitting layer at the positions on the opposite sides of each division line, causing damage to the light emitting layer to result in degradation in quality of each optical device.

It is therefore an object of the present invention to provide a wafer processing method which can divide a wafer into individual optical devices without degradation in quality of each optical device.

In accordance with an aspect of the present invention, there is provided a wafer processing method of dividing a wafer into a plurality of individual optical devices along a plurality of crossing division lines, the wafer being composed of a substrate and a light emitting layer formed on the front side of the substrate, the optical devices being respectively formed in a plurality of regions partitioned by the division lines on the light emitting layer, the wafer processing method including: a modified layer forming step of applying a laser beam having a transmission wavelength to the substrate from the back side of the substrate along the division lines in the condition where the focal point of the laser beam is set inside the substrate, thereby forming a modified layer inside the substrate along each division line; and a wafer dividing step of applying an external force to the wafer to break the wafer from the modified layer as a division start point along each division line after performing the modified layer forming step, thereby dividing the wafer into the individual optical devices; the modified layer forming step including the steps of making the polarization plane of linearly polarized light of the laser beam parallel to the direction perpendicular to each division line, shifting the beam center of the laser beam from the optical axis of a focusing lens of focusing means for focusing the laser beam, in the direction perpendicular to each division line, and shifting the focal point of the laser beam by the focusing lens in the same direction as the direction where the beam center of the laser beam has been shifted, whereby the light intensity of through light not contributing to the formation of the modified layer, but acting on the light emitting layer is adjusted so that the light intensity of the through light is high in the area of each division line and low in the area of each optical device.

The wafer processing method according to the present invention includes the modified layer forming step of applying a laser beam having a transmission wavelength to the substrate from the back side of the substrate along the division lines in the condition where the focal point of the laser beam is set inside the substrate, thereby forming a modified layer inside the substrate along each division line. This modified layer forming step includes the steps of making the polarization plane of linearly polarized light of the laser beam parallel to the direction perpendicular to each division line, shifting the beam center of the laser beam from the optical axis of the focusing lens in the direction perpendicular to each division line, and shifting the focal point of the laser beam by the focusing lens in the same direction as the direction where the beam center of the laser beam has been shifted, whereby the light intensity of through light not contributing to the formation of the modified layer, but acting on the light emitting layer is adjusted so that the light intensity of the through light is high in the area of each division line and low in the area of each optical device. Accordingly, the through light acting on the area of each optical device has a low intensity and therefore causes almost no damage to each optical device.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
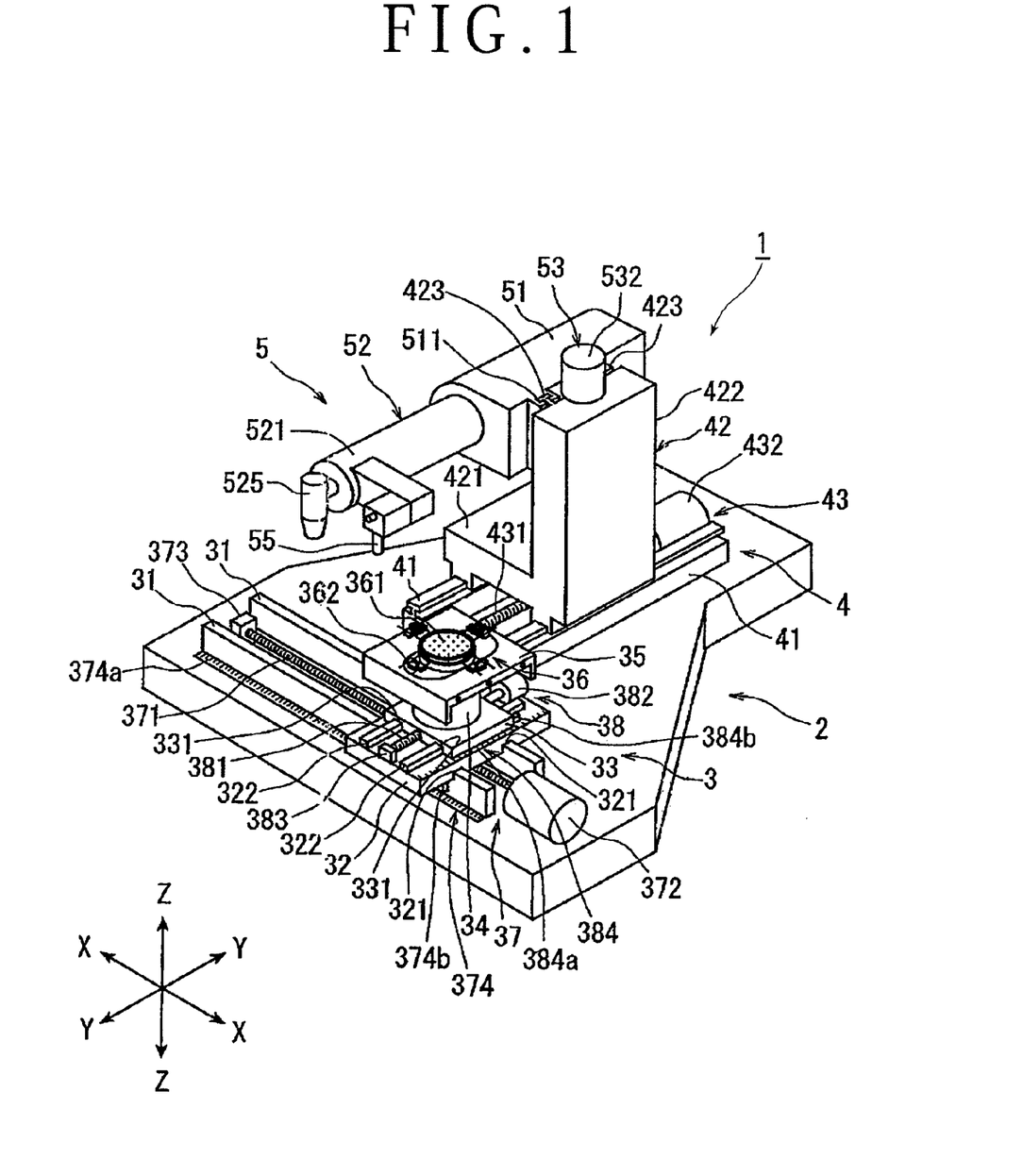
FIG. 1 is a perspective view of a laser processing apparatus for performing the wafer processing method according to the present invention.

A preferred embodiment of the wafer processing method according to the present invention will now be described in more detail with reference to the attached drawings. FIG. 1 is a perspective view of a laser processing apparatus 1 for performing the wafer processing method according to the present invention. The laser processing apparatus 1 shown in FIG. 1 includes a stationary base 2, a chuck table mechanism 3 for holding a wafer as a workpiece, the chuck table mechanism 3 being provided on the stationary base 2 so as to be movable in a feeding direction (X direction) shown by an arrow X, a laser beam applying unit supporting mechanism 4 provided on the stationary base 2 so as to be movable in an indexing direction (Y direction) shown by an arrow Y perpendicular to the X direction, and a laser beam applying unit 5 provided on the laser beam applying unit supporting mechanism 4 so as to be movable in a focal position adjusting direction (Z direction) shown by an arrow Z.

The chuck table mechanism 3 includes a pair of guide rails 31 provided on the stationary base 2 so as to extend parallel to each other in the X direction, a first slide block 32 provided on the guide rails 31 so as to be movable in the X direction, a second slide block 33 provided on the first slide block 32 so as to be movable in the Y direction, a cover table 35 supported by a cylindrical member 34 standing on the second slide block 33, and a chuck table 36 as workpiece holding means. The chuck table 36 has a vacuum chuck 361 formed of a porous material. A workpiece such as a disk-shaped semiconductor wafer is adapted to be held under suction on the vacuum chuck 361 by operating suction means (not shown). The chuck table 36 is rotatable by a pulse motor (not shown) provided in the cylindrical member 34. Further, the chuck table 36 is provided with clamps 362 for fixing an annular frame to be hereinafter described.

The lower surface of the first slide block 32 is formed with a pair of guided grooves 321 for slidably engaging the pair of guide rails 31 mentioned above. A pair of guide rails 322 are provided on the upper surface of the first slide block 32 so as to extend parallel to each other in the Y direction. Accordingly, the first slide block 32 is movable in the X direction along the guide rails 31 by the slidable engagement of the guided grooves 321 with the guide rails 31. The chuck table mechanism 3 further includes X direction moving means 37 for moving the first slide block 32 in the X direction along the guide rails 31. The X direction moving means 37 includes an externally threaded rod 371 extending parallel to the guide rails 31 so as to be interposed therebetween and a pulse motor 372 as a drive source for rotationally driving the externally threaded rod 371. The externally threaded rod 371 is rotatably supported at one end thereof to a bearing block 373 fixed to the stationary base 2 and is connected at the other end to the output shaft of the pulse motor 372 so as to receive the torque thereof. The externally threaded rod 371 is engaged with a tapped through hole formed in an internally threaded block (not shown) projecting from the lower surface of the first slide block 32 at a central portion thereof. Accordingly, the first slide block 32 is moved in the X direction along the guide rails 31 by operating the pulse motor 372 to normally or reversely rotate the externally threaded rod 371.

The laser processing apparatus 1 includes X position detecting means 374 for detecting the feed amount, or X position of the chuck table 36. The X position detecting means 374 includes a linear scale 374a extending along one of the guide rails 31 and a read head 374b provided on the first slide block 32 and movable along the linear scale 374a together with the first slide block 32. The read head 374b of the X position detecting means 374 transmits a pulse signal of one pulse every 1 μm in this preferred embodiment to control means (not shown). The control means counts the number of pulses as the pulse signal input from the read head 374b to thereby detect the feed amount, or X position of the chuck table 36. In the case that the pulse motor 372 is used as the drive source for the X direction moving means 37 as in this preferred embodiment, the number of pulses as a drive signal output from the control means to the pulse motor 372 may be counted by the control means to thereby detect the feed amount, or X position of the chuck table 36.

The lower surface of the second slide block 33 is formed with a pair of guided grooves 331 for slidably engaging the pair of guide rails 322 provided on the upper surface of the first slide block 32 as mentioned above. Accordingly, the second slide block 33 is movable in the Y direction along the guide rails 322 by the slidable engagement of the guided grooves 331 with the guide rails 322. The chuck table mechanism 3 further includes first Y direction moving means 38 for moving the second slide block 33 in the Y direction along the guide rails 322. The first Y direction moving means 38 includes an externally threaded rod 381 extending parallel to the guide rails 322 so as to be interposed therebetween and a pulse motor 382 as a drive source for rotationally driving the externally threaded rod 381. The externally threaded rod 381 is rotatably supported at one end thereof to a bearing block 383 fixed to the upper surface of the first slide block 32 and is connected at the other end to the output shaft of the pulse motor 382 so as to receive the torque thereof. The externally threaded rod 381 is engaged with a tapped through hole formed in an internally threaded block (not shown) projecting from the lower surface of the second slide block 33 at a central portion thereof. Accordingly, the second slide block 33 is moved in the Y direction along the guide rails 322 by operating the pulse motor 382 to normally or reversely rotate the externally threaded rod 381.

The laser processing apparatus 1 includes Y position detecting means 384 for detecting the index amount, or Y position of the chuck table 36. The Y position detecting means 384 includes a linear scale 384a extending along one of the guide rails 322 and a read head 384b provided on the second slide block 33 and movable along the linear scale 384a together with the second slide block 33. The read head 384b of the Y position detecting means 384 transmits a pulse signal of one pulse every 1 μm in this preferred embodiment to the control means. This control means counts the number of pulses as the pulse signal input from the read head 384b to thereby detect the index amount, or Y position of the chuck table 36. In the case that the pulse motor 382 is used as the drive source for the first Y position moving means 38 as in this preferred embodiment, the number of pulses as a drive signal output from the control means to the pulse motor 382 may be counted by the control means to thereby detect the index amount, or Y position of the chuck table 36.

The laser beam applying unit supporting mechanism 4 includes a pair of guide rails 41 provided on the stationary base 2 so as to extend parallel to each other in the Y direction and a movable support base 42 provided on the guide rails 41 so as to be movable in the Y direction. The movable support base 42 is composed of a horizontal portion 421 slidably supported to the guide rails 41 and a vertical portion 422 extending vertically upward from the upper surface of the horizontal portion 421. Further, a pair of guide rails 423 are provided on one side surface of the vertical portion 422 so as to extend parallel to each other in the Z direction. The laser beam applying unit supporting mechanism 4 further includes second Y direction moving means 43 for moving the movable support base 42 in the Y direction along the guide rails 41. The second Y direction moving means 43 includes an externally threaded rod 431 extending parallel to the guide rails 41 so as to be interposed therebetween and a pulse motor 432 as a drive source for rotationally driving the externally threaded rod 431. The externally threaded rod 431 is rotatably supported at one end thereof to a bearing block (not shown) fixed to the stationary base 2 and is connected at the other end to the output shaft of the pulse motor 432 so as to receive the torque thereof. The externally threaded rod 431 is engaged with a tapped through hole formed in an internally threaded block (not shown) projecting from the lower surface of the horizontal portion 421 at a central portion thereof. Accordingly, the movable support base 42 is moved in the Y direction along the guide rails 41 by operating the pulse motor 432 to normally or reversely rotate the externally threaded rod 431.

The laser beam applying unit 5 includes a unit holder 51 and laser beam applying means 52 mounted to the unit holder 51. The unit holder 51 is formed with a pair of guided grooves 511 for slidably engaging the pair of guide rails 423 provided on the vertical portion 422 of the movable support base 42. Accordingly, the unit holder 51 is supported to the movable support base 42 so as to be movable in the Z direction by the slidable engagement of the guided grooves 511 with the guide rails 423.

The laser beam applying unit 5 further includes focal position adjusting means 53 for moving the unit holder 51 along the guide rails 423 in the Z direction. The focal position adjusting means 53 includes an externally threaded rod (not shown) extending parallel to the guide rails 423 so as to be interposed therebetween and a pulse motor 532 as a drive source for rotationally driving this externally threaded rod. Accordingly, the unit holder 51 and the laser beam applying means 52 are moved in the Z direction along the guide rails 423 by operating the pulse motor 532 to normally or reversely rotate this externally threaded rod. In this preferred embodiment, when the pulse motor 532 is normally operated, the laser beam applying means 52 is moved upward, whereas when the pulse motor 532 is reversely operated, the laser beam applying means 52 is moved downward.

The laser beam applying means 52 includes a cylindrical casing 521 fixed to the unit holder 51 so as to extend in a substantially horizontal direction. The configuration of the laser beam applying means 52 will now be described with reference to FIG. 2. The laser beam applying means 52 includes pulsed laser beam oscillating means 522 provided in the casing 521, power adjusting means 523 for adjusting the power of a pulsed laser beam oscillated by the pulsed laser beam oscillating means 522, a half-wave plate 524 for adjusting the polarization plane of the pulsed laser beam adjusted in power by the power adjusting means 523, and focusing means 525 for applying the pulsed laser beam adjusted in polarization plane by the half-wave plate 524 to a workpiece W held on the holding surface of the chuck table 36.

Figure 2:
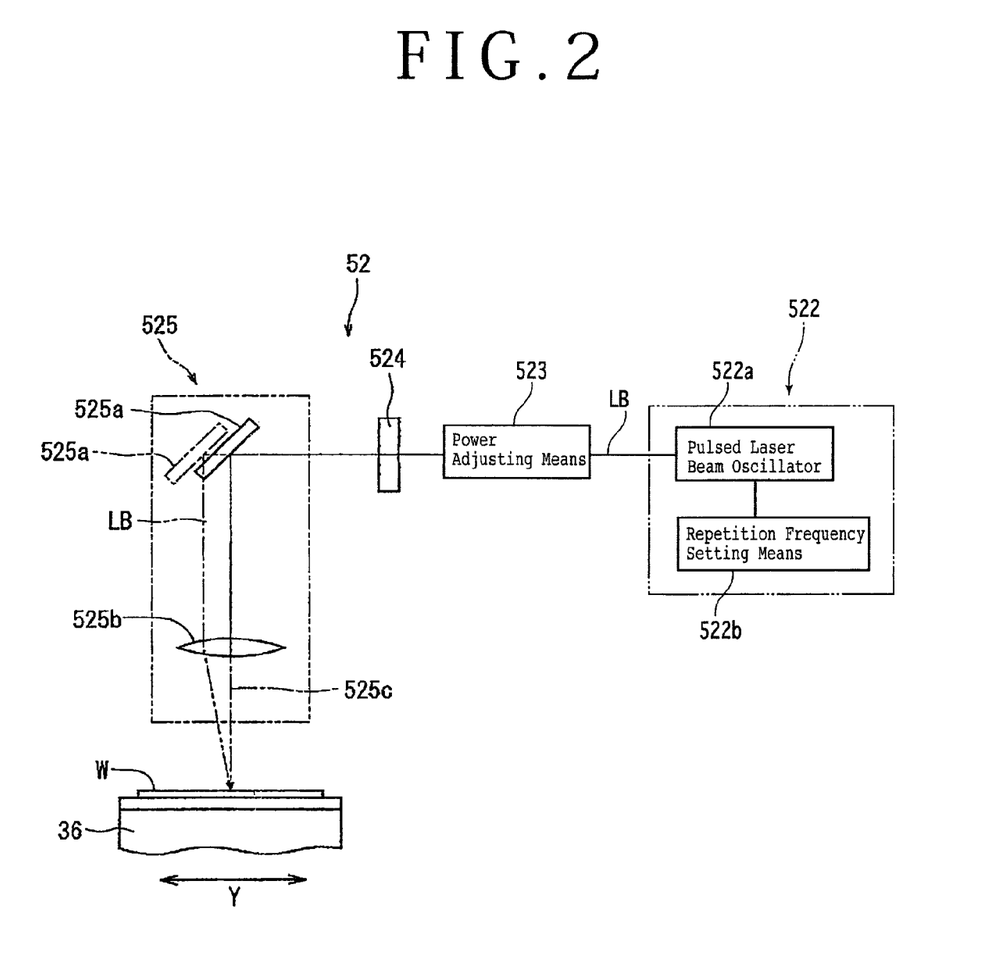
FIG. 2 is a block diagram showing the configuration of laser beam applying means included in the laser processing apparatus shown in FIG. 1.

The pulsed laser beam oscillating means 522 is composed of a pulsed laser beam oscillator 522a for oscillating a pulsed laser beam LB of linearly polarized light and repetition frequency setting means 522b for setting the repetition frequency of the pulsed laser beam to be oscillated by the pulsed laser beam oscillator 522a. The power adjusting means 523 functions to adjust the power of the pulsed laser beam oscillated by the pulsed laser beam oscillating means 522 to a predetermined power. The half-wave plate 524 functions to rotate the polarization plane of the linearly polarized light of the pulsed laser beam adjusted in power by the power adjusting means 523 so that the direction of the polarization plane becomes the Y direction as the indexing direction.

The focusing means 525 includes a direction changing mirror 525a for changing the traveling direction of the pulsed laser beam toward the holding surface of the chuck table 36 after adjusting by the power adjusting means 523 the power of the pulsed laser beam oscillated by the pulsed laser beam oscillating means 522 and next adjusting the direction of the polarization plane to the Y direction, and a focusing lens 525b for focusing the pulsed laser beam whose traveling direction has been changed by the direction changing mirror 525a and applying this pulsed laser beam to the workpiece W held on the chuck table 36. The focusing means 525 having this configuration is mounted at the front end of the casing 521 as shown in FIG. 1. In this preferred embodiment, the direction changing mirror 525a of the focusing means 525 is movable in the Y direction as the indexing direction. Accordingly, when the direction changing mirror 525a is moved from the position shown by a solid line to the position shown by a phantom line in FIG. 2, the beam center of the pulsed laser beam LB incident on the focusing lens 525b is shifted from the optical axis 525c of the focusing lens 525b in the Y direction.

Referring back to FIG. 1, the laser processing apparatus 1 includes imaging means 55 provided at the front end portion of the casing 521 for imaging a subject area of the workpiece to be laser-processed by the laser beam applying means 52. The imaging means 55 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 55 is transmitted to the control means (not shown).

Figure 3A:
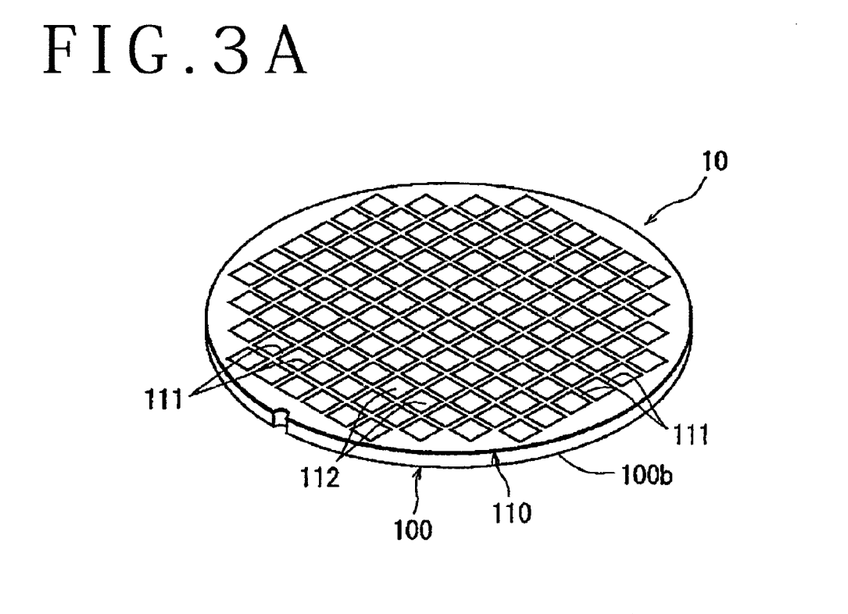
FIG. 3A is a perspective view of an optical device wafer.
Figure 3B:
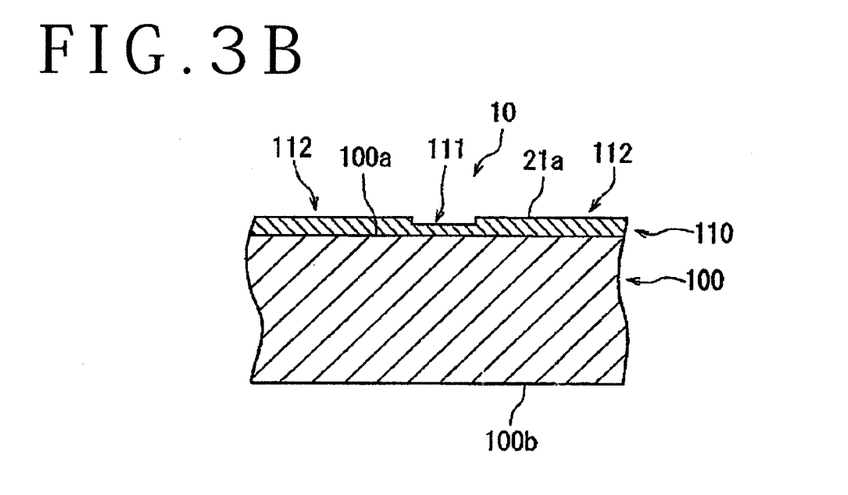
FIG. 3B is an enlarged sectional view of an essential part of the optical device wafer shown in FIG. 3A.

There will now be described a method of forming a modified layer inside a wafer by using the laser processing apparatus 1 mentioned above. FIG. 3A is a perspective view of an optical device wafer 10 to be processed by the wafer processing method according to the present invention, and FIG. 3B is an enlarged sectional view of an essential part of the optical device wafer 10 shown in FIG. 3A. As shown in FIGS. 3A and 3B, the optical device wafer 10 is composed of a substantially disk-shaped sapphire substrate 100 having a front side 100a and a back side 100b and a light emitting layer 110 formed on the front side 100a of the sapphire substrate 100 by epitaxial growth. The light emitting layer 110 is composed of an n-type gallium nitride semiconductor layer and a p-type gallium nitride semiconductor layer. A plurality of crossing division lines 111 are formed on the light emitting layer 110, thereby partitioning a plurality of rectangular regions where a plurality of optical devices 112 such as LEDs are respectively formed. In this preferred embodiment, the width of each division line 111 is set to 30 μm.

Figure 4:
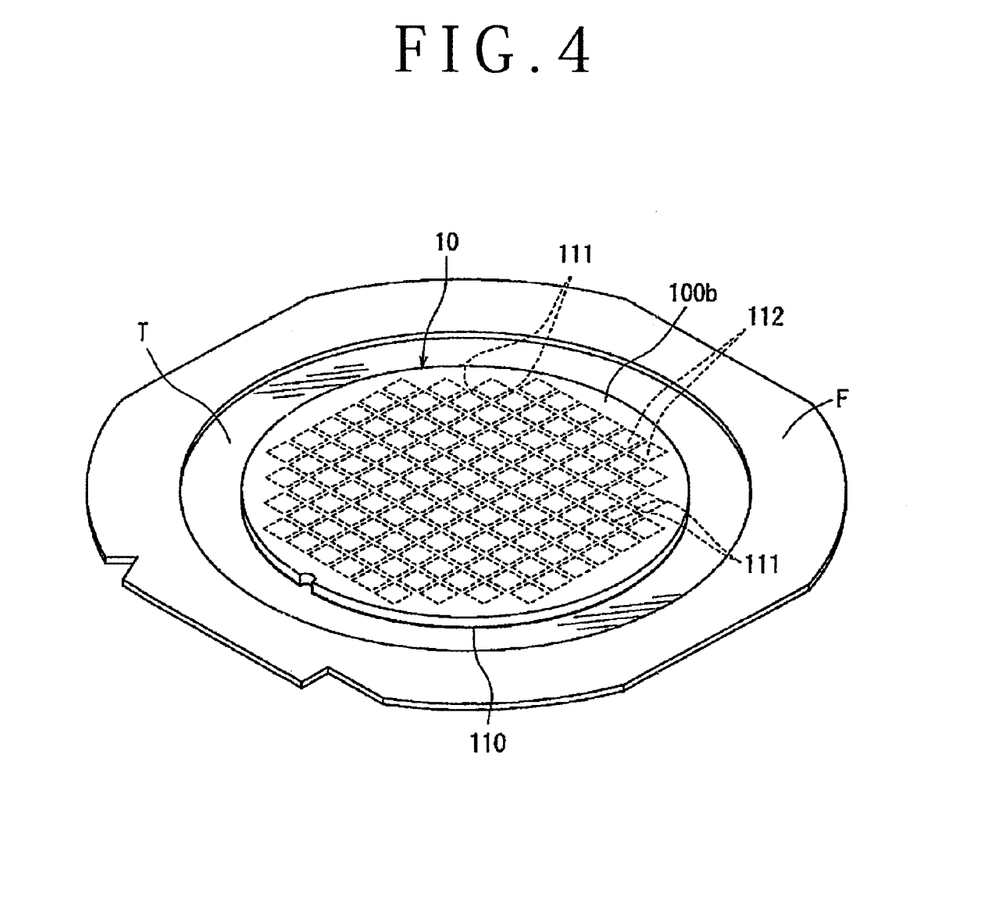
FIG. 4 is a perspective view showing a condition that the optical device wafer shown in FIG. 3A is attached to a dicing tape supported to an annular frame.

As shown in FIG. 4, the optical device wafer 10 shown in FIG. 3A is supported through a dicing tape T to an annular frame F in such a manner that the light emitting layer 110 is attached to the dicing tape T (wafer attaching step). Accordingly, the back side 100b of the sapphire substrate 100 constituting the optical device wafer 10 attached to the dicing tape T is oriented upward.

After performing the wafer attaching step mentioned above, the optical device wafer 10 supported through the dicing tape T to the annular frame F is placed on the chuck table 36 of the laser processing apparatus 1 shown in FIG. 1 in the condition where the dicing tape T comes into contact with the upper surface of the chuck table 36. Thereafter, the suction means (not shown) is operated to hold the optical device wafer 10 through the dicing tape T on the chuck table 36 under suction (wafer holding step). Accordingly, the optical device wafer 10 is held on the chuck table 36 in the condition where the back side 100b of the sapphire substrate 100 constituting the wafer 10 is oriented upward. Further, the annular frame F is fixed by the clamps 362.

Thereafter, the chuck table 36 holding the optical device wafer 10 is moved to a position directly below the imaging means 55 by operating the X direction moving means 37. In the condition where the chuck table 36 is positioned directly below the imaging means 55, an alignment operation is performed by the imaging means 55 and the control means (not shown) to detect a subject area of the optical device wafer 10 to be laser-processed. More specifically, the imaging means 55 and the control means perform image processing such as pattern matching for making the alignment of the division lines 111 extending in a first direction on the optical device wafer 10 and the focusing means 525 of the laser beam applying means 52 for applying the laser beam to the wafer 10 along the division lines 111, thus performing the alignment of a laser beam applying position (alignment step). Similarly, this alignment step is performed for the other division lines 111 extending in a second direction perpendicular to the first direction on the optical device wafer 10. Although the light emitting layer 110 of the optical device wafer 10 on which the division lines 111 are formed is oriented downward, the division lines 111 can be imaged through the sapphire substrate 100 from the back side 100b thereof because the imaging means 55 includes the infrared light applying means for applying infrared light to the wafer 10, the optical system for capturing the infrared light applied to the wafer 10, and the imaging device (infrared CCD) for outputting an electrical signal corresponding to the infrared light captured by the optical system as described above.

Figure 5A:
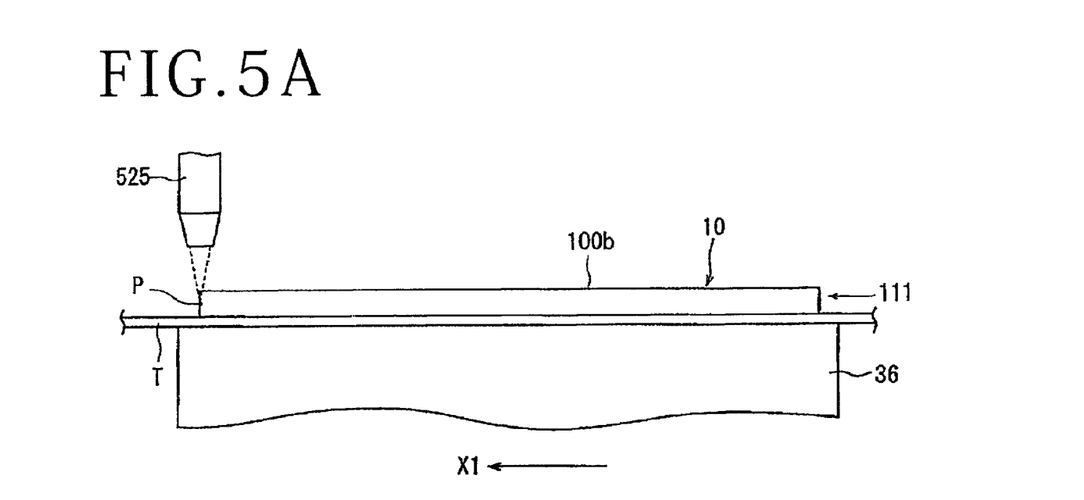
FIGS. 5A to 5C are views for illustrating a modified layer forming step.
Figure 6A:
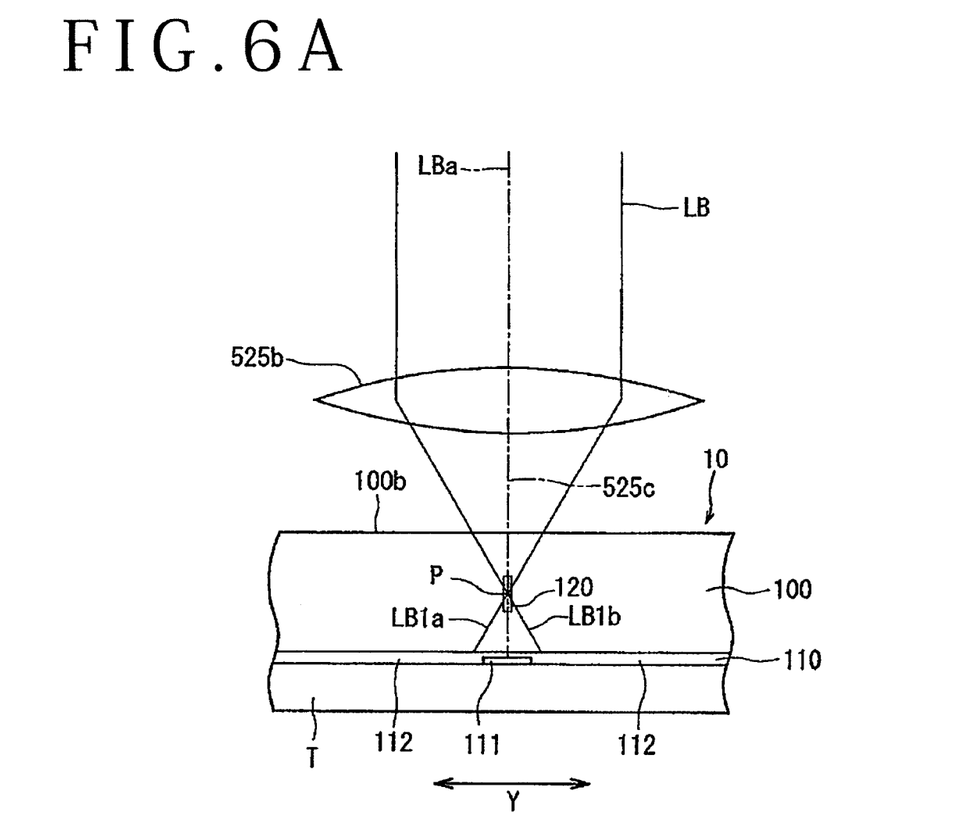
FIGS. 6A and 6B are views for illustrating the light intensity of through light in the case that the beam center of a laser beam coincides with the optical axis of a focusing lens.
Figure 6B:
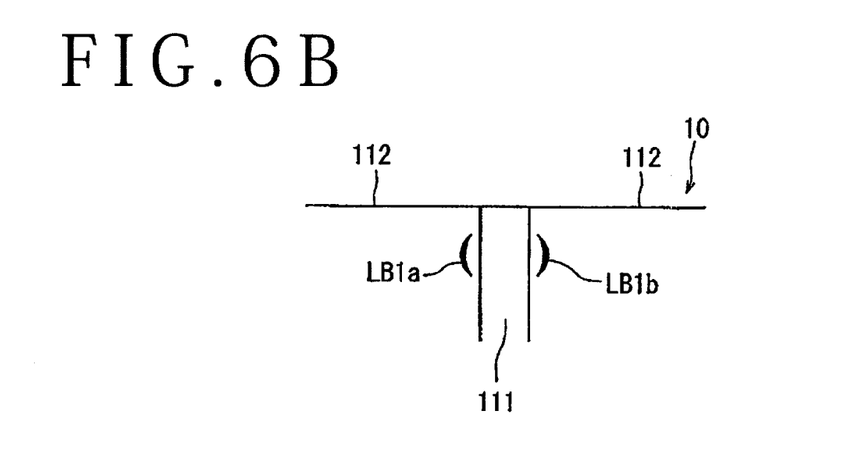

After performing the alignment step mentioned above for all of the division lines 111, the chuck table 36 is moved to a laser beam applying area where the focusing means 525 of the laser beam applying means 52 is located as shown in FIG. 5A, thereby positioning one end (left end as viewed in FIG. 5A) of a predetermined one of the division lines 111 extending in the first direction directly below the focusing means 525. Further, the focal point P of a pulsed laser beam LB to be applied from the focusing lens 525b of the focusing means 525 is set at an intermediate position in the direction along the thickness of the sapphire substrate 100 constituting the optical device wafer 10 as shown in FIG. 6A. In the condition shown in FIG. 6A, the beam center LBa of the pulsed laser beam LB coincides with the optical axis 525c of the focusing lens 525b. When the pulsed laser beam LB is applied in the condition shown in FIG. 6A, a modified layer 120 is formed about the focal point P inside the sapphire substrate 100 of the optical device wafer 10. At the same time, a part of the pulsed laser beam LB not contributing to the formation of the modified layer 120 acts as through lights LB1a and LB1b on the light emitting layer 110. As shown in FIG. 6B, the through lights LB1a and LB1b are applied on the opposite sides of the predetermined division line 111 to cause damage to the light emitting layer 110, resulting in a degradation in quality of each optical device 112. In the condition shown in FIG. 6A, the light intensity of the through light LB1a is the same as that of the through light LB1b.

Figure 7A:
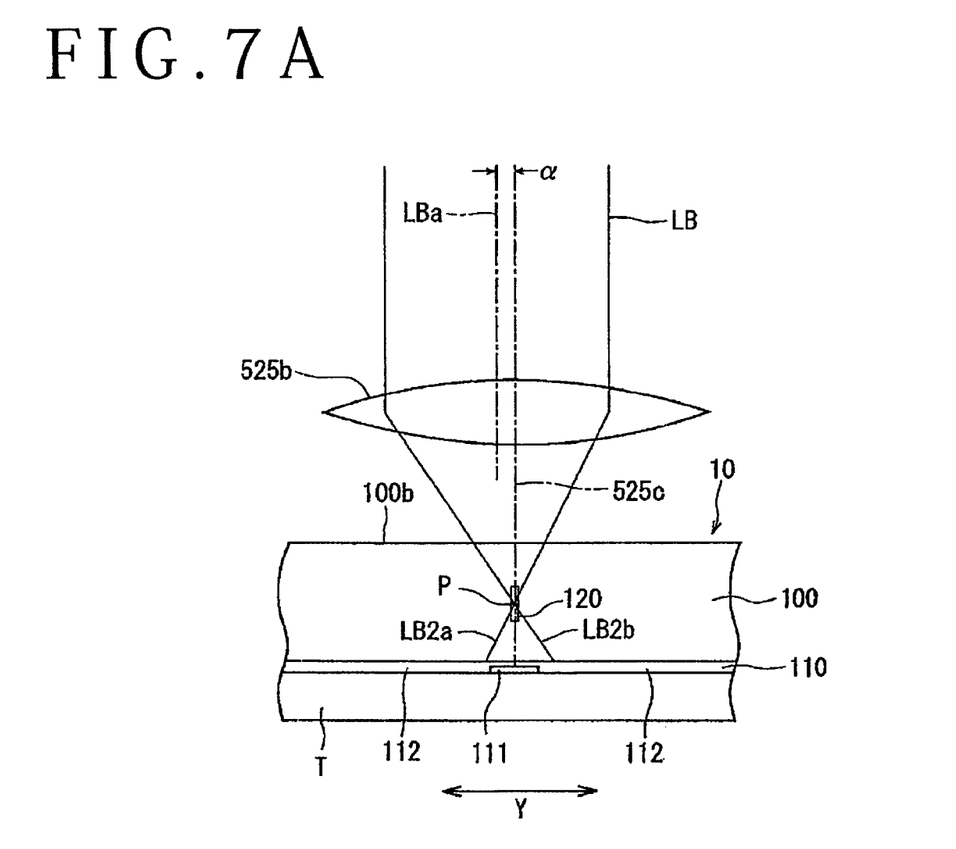
FIGS. 7A and 7B are views for illustrating the light intensity of through light in the case that the beam center of the laser beam is shifted from the optical axis of the focusing lens in the direction perpendicular to a division line.
Figure 7B:
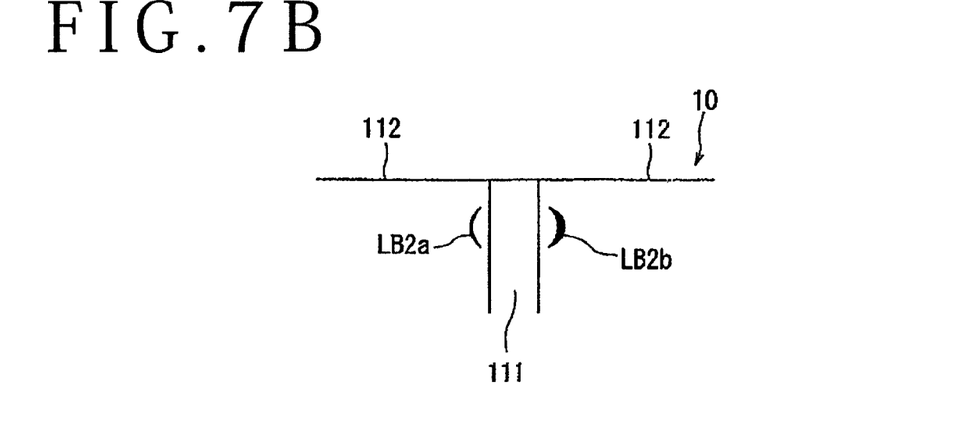

To solve this problem, the beam center LBa of the pulsed laser beam LB is first shifted by an amount (a) from the optical axis 525c of the focusing lens 525b in the Y direction, i.e., in the direction perpendicular to the predetermined division line 111 in the present invention as shown in FIG. 7A. The shift amount (a) is set to 10 μm, for example. When the beam center LBa of the pulsed laser beam LB is shifted from the optical axis 525c of the focusing lens 525b in the direction perpendicular to the predetermined division line 111 as mentioned above, the light intensity of through light LB2a not contributing to the formation of the modified layer 120 becomes lower than that of each of the through lights LB1a and LB1b, thereby almost eliminating the damage to the optical device 112 on one side of the predetermined division line 111 as shown in FIG. 7B. However, the light intensity of through light LB2b becomes higher than that of each of the through lights LB1a and LB1b, thereby increasing the damage to the optical device 112 on the other side of the predetermined division line 111 as shown in FIG. 7B.

Figure 8A:
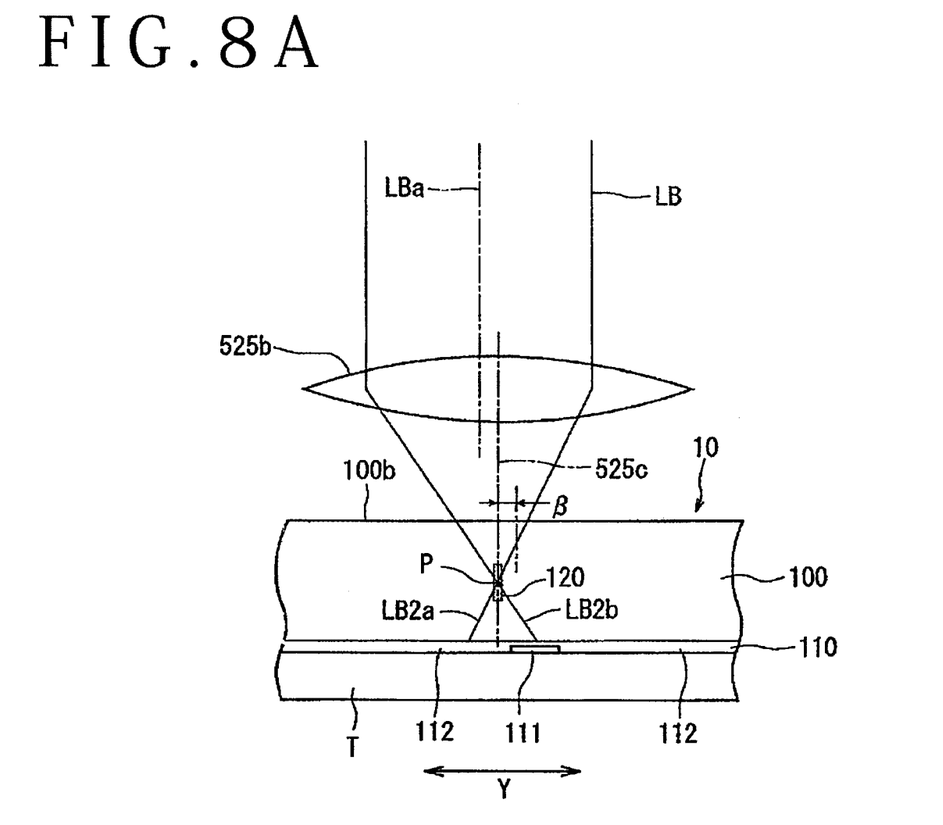
FIGS. 8A and 8B are views for illustrating the position where the through light acts on in the case that the focal point of the laser beam by the focusing lens is shifted from the position shown in FIG. 7A in the same direction as the direction where the beam center of the laser beam has been shifted.
Figure 8B:
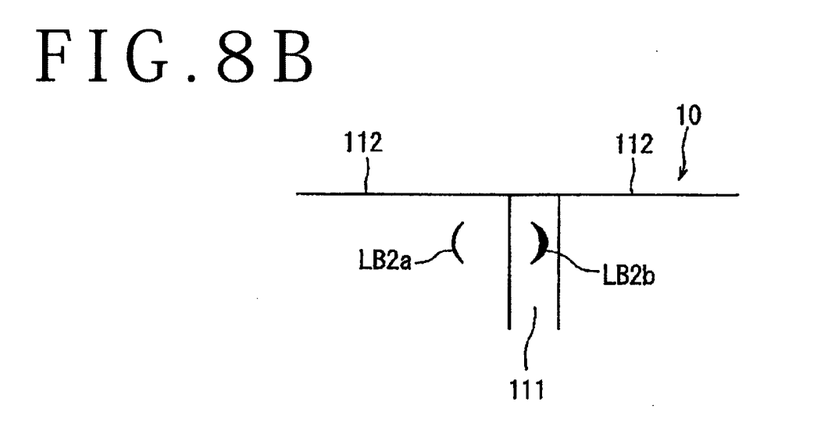

To prevent the damage to the optical device 112 by the through light LB2b, the focal point P of the pulsed laser beam LB by the focusing lens 525b is shifted by an amount (β) from the position shown in FIG. 7A in the same direction as the direction where the beam center LBa of the pulsed laser beam LB has been shifted in the present invention as shown in FIG. 8A. Accordingly, the light intensity of the through lights LB2a and LB2b not contributing to the formation of the modified layer 120, but acting on the light emitting layer 110 is adjusted so that the light intensity of the through light LB2b is high in the area of the predetermined division line 111 and the light intensity of the through light LB2a is low in the area of the optical device 112. A method of shifting the focal point P of the pulsed laser beam LB by the focusing lens 525b in the same direction as the direction where the beam center LBa of the pulsed laser beam LB has been shifted may include a method of moving the focusing means 525 in the Y direction and a method of moving the chuck table 36 holding the optical device wafer 10 in the Y direction. The shift amount (β) of the focal point P of the pulsed laser beam LB by the focusing lens 525b is set to 10 μm, for example. As a result, the through light LB2b having a high intensity acts on the area of the predetermined division line 111 and the through light LB2a having a low intensity acts on the area of the optical device 112 as shown in FIG. 8B. In this manner, the through light acting on the area of the optical device 112 is only the through light LB2a having a low intensity, so that the damage to the optical device 112 can be almost eliminated.

Figure 5B:
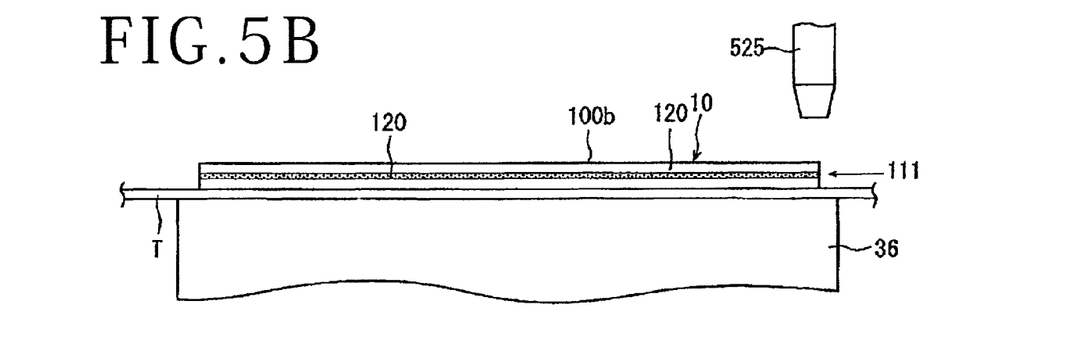
Figure 5C:
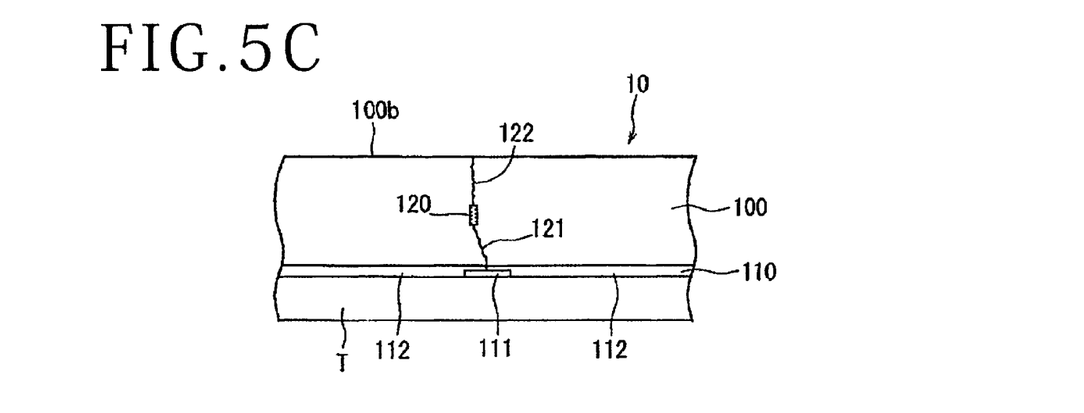

After adjusting the focal point P of the pulsed laser beam LB by the focusing lens 525b to the position shown in FIG. 8A as mentioned above, the laser beam applying means 52 is operated to apply the pulsed laser beam having a transmission wavelength to a sapphire substrate from the focusing means 525 to the optical device wafer 10, and the chuck table 36 is moved in the direction shown by an arrow X1 in FIG. 5A at a predetermined feed speed. When the other end (right end as viewed in FIG. 5B) of the predetermined division line 111 reaches the position directly below the focusing means 525 as shown in FIG. 5B, the application of the pulsed laser beam is stopped and the movement of the chuck table 36 is also stopped. As a result, the modified layer 120 is formed inside the sapphire substrate 100 of the optical device wafer 10 along the predetermined division line 111 as shown in FIG. 5B. As shown in FIG. 5C, the modified layer 120 is formed at an intermediate position in the direction along the thickness of the sapphire substrate 100. Further, a first crack 121 is formed so as to extend from the lower end of the modified layer 120 to the area of the predetermined division line 111, and a second crack 122 is formed so as to extend from the upper end of the modified layer 120 to the back side 100b of the sapphire substrate 100 (modified layer forming step).

For example, the modified layer forming step mentioned above is performed under the following processing conditions.

Light source: YAG pulsed laser
Wavelength: 1064 nm
Repetition frequency: 100 kHz
Average power: 0.5 W
Pulse width: 120 ns
Focused spot diameter: 1 μm
Work feed speed: 200 mm/s
Power of through light: 0.2 W
On the division line: 0.18 W
On the optical device: 0.02 W After performing the modified layer forming step along the predetermined division line 111 as mentioned above, the chuck table 36 is moved in the indexing direction shown by the arrow Y in FIG. 1 by the pitch of the division lines 111 formed on the optical device wafer 10 (indexing step), and the modified layer forming step is similarly performed along the next division line 111 extending in the first direction. In this manner, the modified layer forming step is performed along all of the division lines 111 extending in the first direction. Thereafter, the chuck table 36 is rotated 90 degrees to similarly perform the modified layer forming step along all of the division lines 111 extending in the second direction perpendicular to the first direction.

Figure 9:
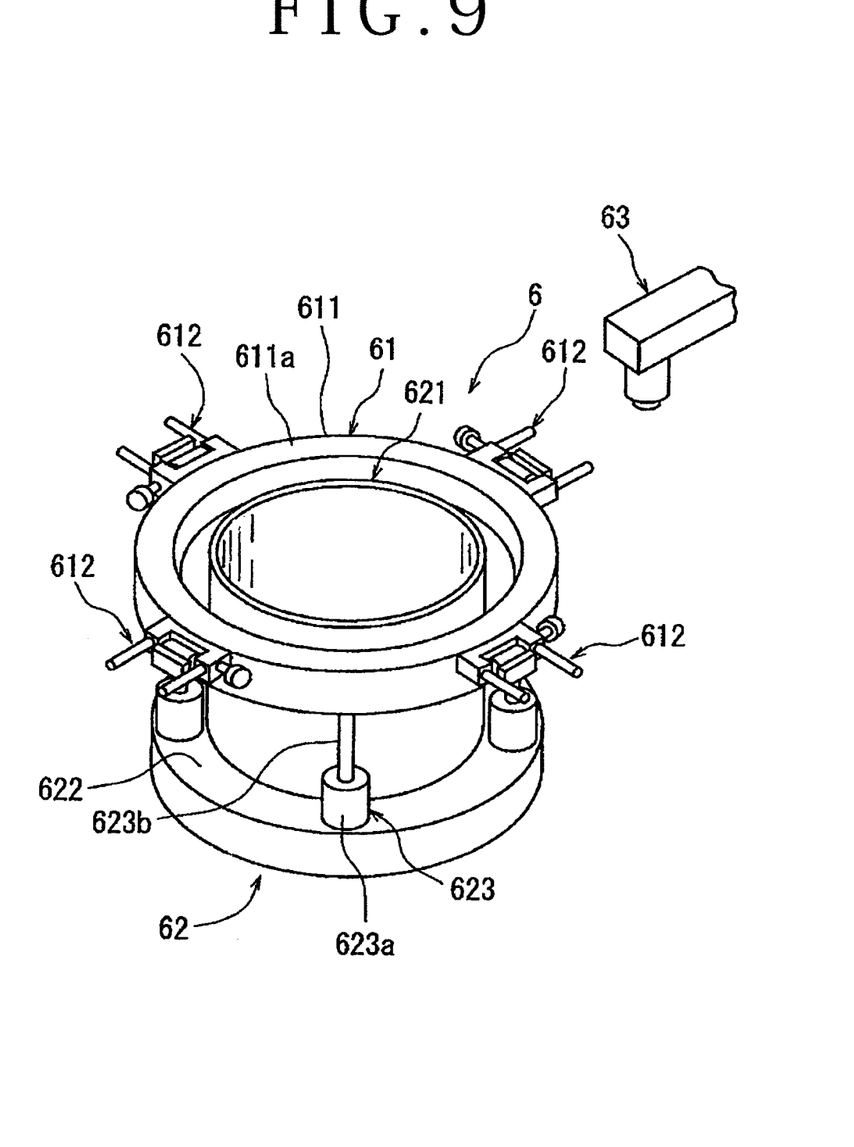
FIG. 9 is a perspective view of a dividing apparatus for performing a wafer dividing step.

After performing the modified layer forming step mentioned above, a wafer dividing step is performed in such a manner that an external force is applied to the optical device wafer 10 to divide the wafer 10 along the division lines 111 where the modified layers 120 are respectively formed, thereby obtaining the individual optical devices 112. This wafer dividing step is performed by using a dividing apparatus 6 shown in FIG. 9. The dividing apparatus 6 shown in FIG. 9 includes frame holding means 61 for holding the annular frame F, tape expanding means 62 for expanding the dicing tape T supported to the annular frame F held by the frame holding means 61, and a pickup collet 63. The frame holding means 61 includes an annular frame holding member 611 and a plurality of clamps 612 as fixing means provided on the outer circumference of the frame holding member 611. The upper surface of the frame holding member 611 functions as a mounting surface 611a for mounting the annular frame F thereon. The annular frame F mounted on the mounting surface 611a is fixed to the frame holding member 611 by the clamps 612. The frame holding means 61 is supported by the tape expanding means 62 so as to be vertically movable.

Figure 10A:
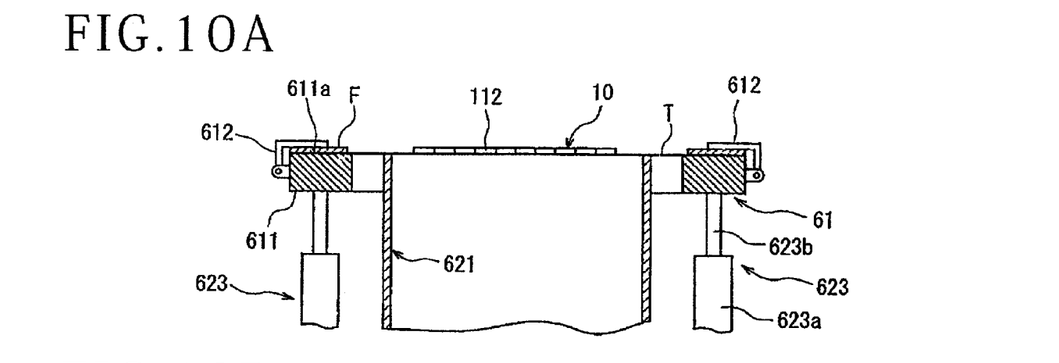
FIGS. 10A to 10C are sectional side views for illustrating the wafer dividing step.
Figure 10B:
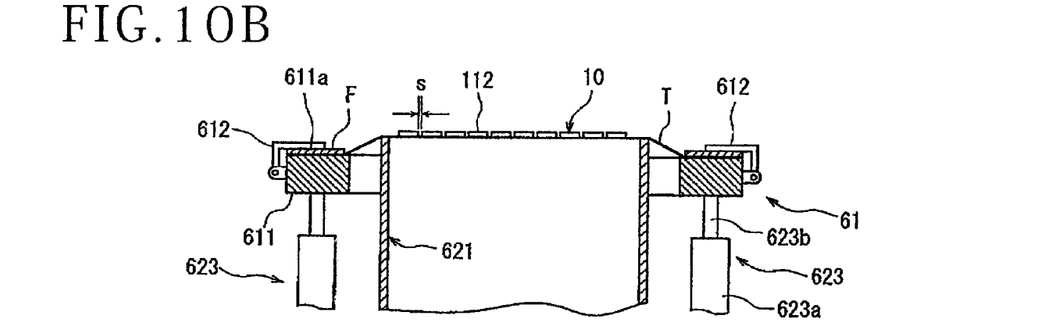

The tape expanding means 62 includes an expanding drum 621 provided inside of the annular frame holding member 611. The expanding drum 621 has an outer diameter smaller than the inner diameter of the annular frame F and an inner diameter larger than the outer diameter of the optical device wafer 10 attached to the dicing tape T supported to the annular frame F. The expanding drum 621 has a supporting flange 622 at the lower end of the drum 621. The tape expanding means 62 further includes supporting means 623 for vertically movably supporting the annular frame holding member 611. The supporting means 623 is composed of a plurality of air cylinders 623a provided on the supporting flange 622. Each air cylinder 623a is provided with a piston rod 623b connected to the lower surface of the annular frame holding member 611. The supporting means 623 composed of these plural air cylinders 623a functions to vertically move the annular frame holding member 611 so as to selectively take a reference position where the mounting surface 611a is substantially equal in height to the upper end of the expanding drum 621 as shown in FIG. 10A and an expansion position where the mounting surface 611a is lower in height than the upper end of the expanding drum 621 by a predetermined amount as shown in FIG. 10B.

The wafer dividing step using the dividing apparatus 6 will now be described with reference to FIGS. 10A to 10C. As shown in FIG. 10A, the annular frame F supporting the optical device wafer 10 through the dicing tape T is mounted on the mounting surface 611a of the frame holding member 611 of the frame holding means 61. Thereafter, the annular frame F is fixed to the frame holding member 611 by the clamps 612 (frame holding step). At this time, the frame holding member 611 is set at the reference position shown in FIG. 10A. Thereafter, the air cylinders 623a as the supporting means 623 of the tape expanding means 62 are operated to lower the frame holding member 611 to the expansion position shown in FIG. 10B. Accordingly, the annular frame F fixed to the mounting surface 611a of the frame holding member 611 is also lowered, so that the dicing tape T supported to the annular frame F comes into abutment against the upper end of the expanding drum 621 and is expanded as shown in FIG. 10B (tape expanding step). As a result, a tensile force radially acts on the optical device wafer 10 attached to the dicing tape T. Accordingly, the optical device wafer 10 is divided into the individual optical devices 112 along the division lines 111 where the modified layers 120, the first cracks 121, and the second cracks 122 are respectively formed to be reduced in strength. At the same time, a spacing S is formed between any adjacent ones of the individual optical devices 112.

Figure 10C:
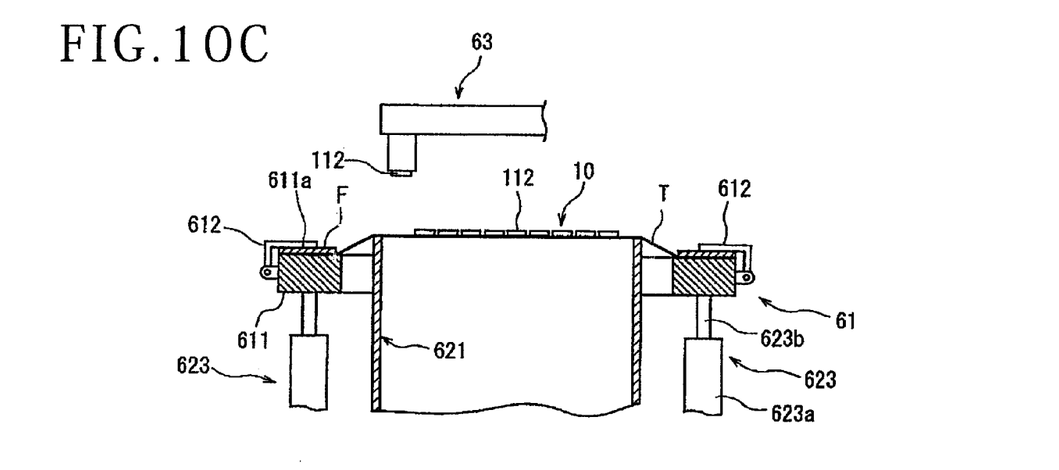

Thereafter, the pickup collet 63 is operated to hold each optical device 112 under suction and peel it from the dicing tape T, thereby individually picking up the optical devices 112 as shown in FIG. 10C (pickup step). Each optical device 112 is next transferred to a tray (not shown) or any apparatus for performing a die bonding step. In the pickup step, each optical device 112 can be easily picked up without the contact with its adjacent optical device 112 because the spacing S is formed between any adjacent ones of the individual optical devices 112 attached to the dicing tape T.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method of dividing a wafer into a plurality of individual optical devices along a plurality of crossing division lines, said wafer being composed of a substrate and a light emitting layer formed on a front side of said substrate, said optical devices being respectively formed in a plurality of regions partitioned by said division lines on said light emitting layer, said wafer processing method comprising:
   a modified layer forming step of applying a laser beam having a transmission wavelength to said substrate from a back side of said substrate along said division lines in a condition where a focal point of said laser beam is set inside said substrate, thereby forming said modified layer inside said substrate along each division line; and
   a wafer dividing step of applying an external force to said wafer to break said wafer from said modified layer as a division start point along each division line after performing said modified layer forming step, thereby dividing said wafer into said individual optical devices;
   said modified layer forming step including the steps of
      making a polarization plane of linearly polarized light of said laser beam parallel to a direction perpendicular to each division line,
      shifting a beam center of said laser beam from an optical axis of a focusing lens of focusing means for focusing said laser beam, in the direction perpendicular to each division line, and
      shifting the focal point of said laser beam by said focusing lens in a same direction as the direction where the beam center of said laser beam has been shifted, whereby a light intensity of through light not contributing to the formation of said modified layer, but acting on said light emitting layer is adjusted so that the light intensity of said through light is high in the area of each division line and low in the area of each optical device.

* * * * *